US012737525B2

(12) United States Patent
Mung

(10) Patent No.: US 12,737,525 B2
(45) Date of Patent: Sep. 15, 2026

(54) ELECTRICAL CIRCUIT COMPONENT FOR AN RF/EM CIRCUIT, A METHOD FOR USE IN RF/EM CIRCUIT DESIGN AND AN ELECTRICAL CIRCUIT DESIGN PLATFORM

(71) Applicant: The Education University of Hong Kong, Tai Po (HK)

(72) Inventor: Wai Yin Mung, Tai Po (HK)

(73) Assignee: The Education University of Hong Kong, Tai Po (HK)

( * ) Notice: Subject to any disclaimer, the term of this patent is extended or adjusted under 35 U.S.C. 154(b) by 789 days.

(21) Appl. No.: 18/164,776

(22) Filed: Feb. 6, 2023

(65) Prior Publication Data

US 2024/0265189 A1 Aug. 8, 2024

(51) Int. Cl.
*G06F 30/398* (2020.01)

(52) U.S. Cl.
CPC .................................. *G06F 30/398* (2020.01)

(58) Field of Classification Search
CPC ..................................................... G06F 30/398
USPC ......................................................... 716/100
See application file for complete search history.

(56) References Cited

U.S. PATENT DOCUMENTS 6,281,843 B1 * 8/2001 Evtioushkine ........... H01Q 1/38 343/815
9,912,072 B1 * 3/2018 Mandeville ........ H01Q 21/0075
11,966,616 B2 * 4/2024 Muchherla ........... G11C 29/021
12,113,265 B2 * 10/2024 Sutono ................ H01L 23/5283
12,418,087 B2 * 9/2025 Guo .......................... H01P 5/10
2014/0266490 A1 * 9/2014 Xiao ......................... H01P 3/08 29/846
2019/0043816 A1 * 2/2019 Sutono .................... H01L 23/66
2020/0062408 A1 * 2/2020 Bratianu-Badea ..... B64D 15/12
2021/0367350 A1 * 11/2021 Zhao .................... H01Q 15/246
2022/0311114 A1 * 9/2022 Sutono ...................... H01P 3/08
2024/0265189 A1 * 8/2024 Mung ................... G06F 30/398
2025/0006666 A1 * 1/2025 Sir ........................ H01P 11/003
2025/0079721 A1 * 3/2025 Kay ......................... H01Q 1/02

* cited by examiner

*Primary Examiner* — Suchin Parihar
(74) *Attorney, Agent, or Firm* — FASKEN MARTINEAU DUMOULIN LLP; Kimberly A. Peaslee

(57) ABSTRACT

An electrical circuit component for an RF/EM circuit, a method for use in RF/EM circuit design and an electrical circuit design platform. The electrical circuit component comprises a double-sided parallel-strip line (DSPSL) having a balanced line arranged to reject external noise from connected circuit components when fed to other electrical circuits during operation of the RF/EM circuit; wherein the DSPSL includes a pair of parallel-strip lines of conducting plate disposed back-to-back on opposite sides of a substrate, and the DSPSL is provided as a computer-implemented circuit component for use on an electrical circuit design platform.

19 Claims, 12 Drawing Sheets

ELECTRICAL CIRCUIT COMPONENT FOR AN RF/EM CIRCUIT, A METHOD FOR USE IN RF/EM CIRCUIT DESIGN AND AN ELECTRICAL CIRCUIT DESIGN PLATFORM

TECHNICAL FIELD

The invention relates to an electrical circuit component for an RF/EM (radio frequencies/electromagnetic) circuit, a method for use in RF/EM circuit design and an electrical circuit design platform, and particularly, although not exclusively, to an RF/EM circuit model for use in RF/EM circuit design and simulation.

BACKGROUND

Passive circuit components such as power dividers and couplers are important components in the wireless communication. Traditional passive components are normally designed by transmission line, therefore, the size of components is limited by the transmission line's length and width.

For example, two quarter-wave transmission lines are required in the conventional Wilkinson power divider. Therefore, different phase inverters were commonly implemented in amplifiers, dividers, filters, rat-race hybrids to improve the circuit's performance as well as size reduction. To further improve performances of these components or circuits, simulators may be used to evaluate circuit performance without requiring the circuit being fabricated.

SUMMARY OF THE INVENTION

In accordance with a first aspect of the present invention, there is provided an electrical circuit component for an RF/EM circuit, comprising a double-sided parallel-strip line (DSPSL) having a balanced line arranged to reject external noise from connected circuit components when fed to other electrical circuits during operation of the RF/EM circuit; wherein the DSPSL includes a pair of parallel-strip lines of conducting plate disposed back-to-back on opposite sides of a substrate.

In accordance with the first aspect, the DSPSL is provided as a computer-implemented circuit component for use on an electrical circuit design platform.

In accordance with the first aspect, the DSPSL is arranged to operate together with other active and passive components in the RF/EM circuit, wherein the RF/EM circuit is a simulated electrical circuit.

In accordance with the first aspect, the RF/EM circuit includes an in-phase power divider, an out-of-phase power divider, a bandpass filter, a rat-race hybrid circuit, and a DC biasing network, a push-pull amplifier and an oscillator.

In accordance with the first aspect, the RF/EM circuit includes a balanced circuit, and the pair of parallel-strip lines are electrically connected by a via across the substrate In accordance with the first aspect, the DSPSL comprises a virtual ground plane between the DSPSL.

In accordance with the first aspect, the DSPSL comprises no physical ground planes.

In accordance with the first aspect, the virtual ground plane is defined at a mid-point of a dielectric separation between the pair of parallel-strip lines of conducting plate.

In accordance with the first aspect, the DSPSL further comprising an inserted conductor plane at a mid-point of a dielectric separation between the pair of parallel-strip lines of conducting plate.

In accordance with a second aspect of the present invention, there is provided a method for use in RF/EM circuit design, comprising the step of: including a double-sided parallel-strip line (DSPSL) as an electrical circuit component having a balanced line arranged to reject external noise from connected circuit components when fed to other electrical circuits during operation of an RF/EM circuit; wherein the DSPSL includes a pair of parallel-strip lines of conducting plate disposed back-to-back on opposite sides of a substrate.

In accordance with the second aspect, the DSPSL is provided as a computer-implemented circuit component for use on an electrical circuit design platform.

In accordance with the second aspect, the DSPSL is arranged to operate together with other active and passive components in the RF/EM circuit, wherein the RF/EM circuit is a simulated electrical circuit.

In accordance with the second aspect, the RF/EM circuit includes an in-phase power divider, an out-of-phase power divider, a bandpass filter, a rat-race hybrid circuit, and a DC biasing network, a push-pull amplifier and an oscillator.

In accordance with the second aspect, the RF/EM circuit includes a balanced circuit and the pair of parallel-strip lines are electrically connected by a via across the substrate.

In accordance with the second aspect, the DSPSL comprises a virtual ground plane between the DSPSL.

In accordance with the second aspect, the DSPSL comprises no physical ground planes.

In accordance with the second aspect, the virtual ground plane is defined at a mid-point of a dielectric separation between the pair of parallel-strip lines of conducting plate.

In accordance with the second aspect, the DSPSL further comprising an inserted conductor plane at a mid-point of a dielectric separation between the pair of parallel-strip lines of conducting plate.

In accordance with the second aspect, the method further comprises the step of simulating a circuit performance of the RF/EM circuit including the DSPSL on the electrical circuit design platform without using an electromagnetic (EM) simulator.

In accordance with a third aspect of the present invention, there is provided an electrical circuit design platform comprising computer-executable instructions, when being executed, arranged to perform a method for use in RF/EM circuit design in accordance with the second aspect.

BRIEF DESCRIPTION OF THE DRAWINGS

Embodiments of the present invention will now be described, by way of example, with reference to the accompanying drawings in which.

DETAILED DESCRIPTION OF THE PREFERRED EMBODIMENTS

The inventors devised that passive components such as power dividers and couplers are important components in the wireless communication. Traditional passive components are normally designed by transmission line, therefore, the size of components is limited by the transmission line's length and width. For example, two quarter-wave transmission lines are required in the conventional Wilkinson power divider. Therefore, different phase inverters may be implemented in amplifiers, dividers, filters, rat-race hybrids to improve the circuit's performance as well as size reduction. The linearity was improved in amplifiers and the bandwidth was enhanced in passive circuits.

Apart from different topologies applied in passive components, active devices and lumped-elements were also used in circulators and power dividers/hybrids respectively. These components are, therefore, compatible with integrated circuit's fabrication. Active devices were used in circulators to replace ferrite circulator for Tx/Rx circuit so the RF front-end circuits become simple. The Jumped-element passive components such as Wilkinson power dividers and rat-race hybrids have also been investigated to improve its size and simplicity. It is possible to replace the transmission lines in traditional passive components by Jumped-elements, which gives significant improvement in its characteristics as well as size reduction. This provides a simple and attractive method for size miniaturization in integrated circuit.

Without wishing to be bound by theory, double-sided parallel-strip line (DSPSL) may also be used in active and passive circuits. Preferably, a DSPSL may include a balanced line without a ground plane. The advantage of the balanced transmission line is the good rejection of external noise when fed to other active and passive circuits. Compared to microstrip line (MSL), higher characteristics impedance transmission can be implemented in DSPSL for low-pass filter and the unequal power divider/combiner. Therefore, in active circuit, push-pull amplifier and oscillator using DSPSL may take the advantages of differential pairs for balanced circuit design. In-phase and out-of-phase power dividers, bandpass filters, rat-race hybrids, and DC biasing networks are examples of passive circuits with different topologies using DSPSL. These passive components using DSPSL may be simulated by electromagnetic (EM) simulator if DSPSL circuit model is not supported in circuit design software.

The inventors devised that, EM simulation may be required to be run separately and then ported to the circuit design software when the DSPSL is used in the circuit. For example, circuit model of the MSL circuit model may be used for DSPSL circuit model simulation, therefore, DSPSL circuit model can be used in circuit design software to deliver accurate and faster simulation with other active and passive devices for RF/microwave invention development.

Figure 1:
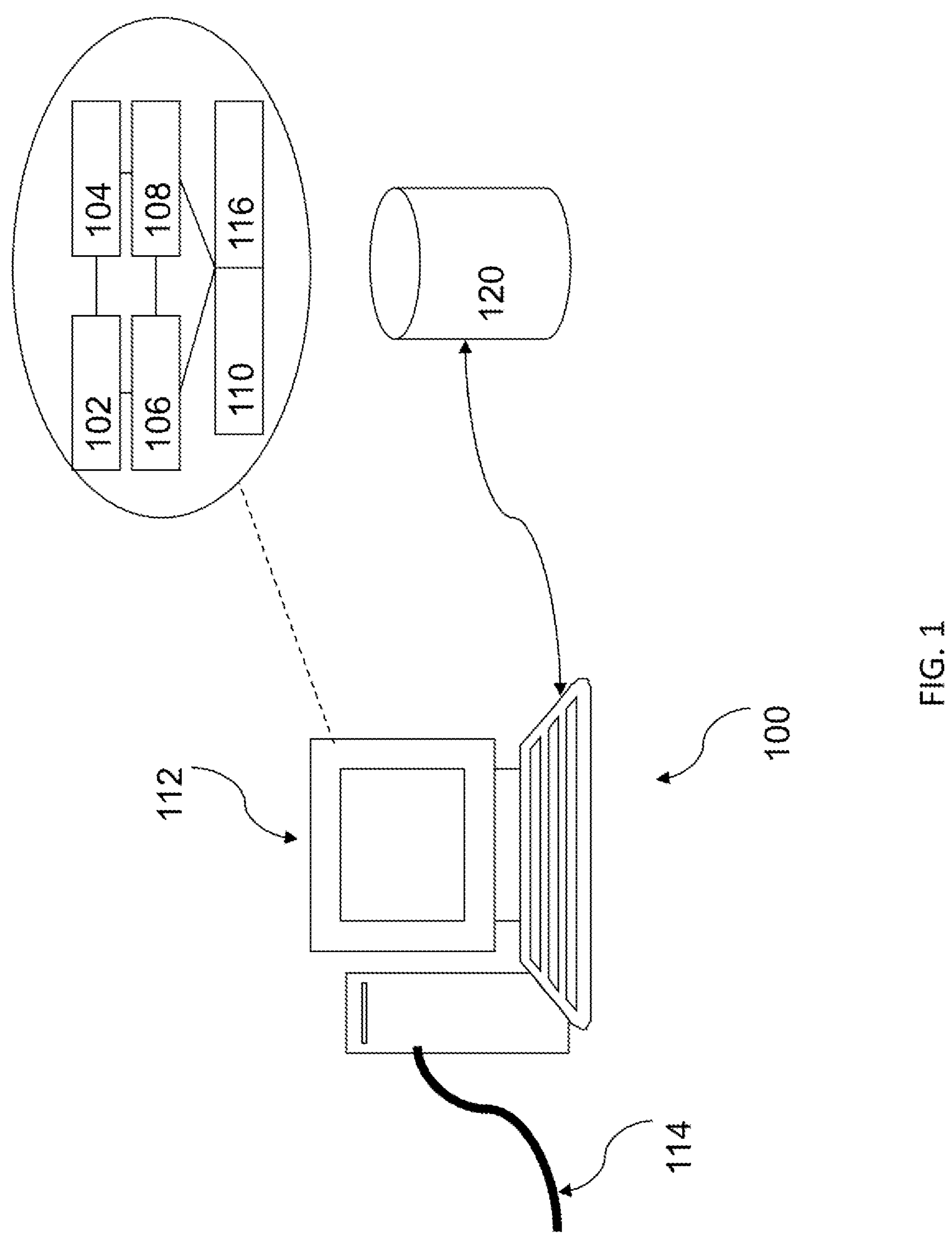
FIG. 1 is a schematic diagram of a computer server which is arranged to be implemented as an electrical circuit design platform including an electrical circuit component for an RF/EM circuit in accordance with an embodiment of the present invention.

Referring to FIG. 1, an embodiment of the present invention is illustrated. This embodiment is arranged to provide an electrical circuit design platform comprising computer-executable instructions, when being executed, arranged to perform a method for use in RF/EM circuit design. For example, the method for use in RF/EM circuit design may comprises the step of including a double-sided parallel-strip line (DSPSL) as an electrical circuit component having a balanced line arranged to reject external noise from connected circuit components when fed to other electrical circuits during operation of an RF/EM circuit; wherein the DSPSL includes a pair of parallel-strip lines of conducting plate disposed back-to-back on opposite sides of a substrate.

In this example embodiment, the interface and processor are implemented by a computer having an appropriate user interface. The computer may be implemented by any computing architecture, including portable computers, tablet computers, stand-alone Personal Computers (PCs), smart devices, Internet of Things (IoT) devices, edge computing devices, client/server architecture, "dumb" terminal/mainframe architecture, cloud-computing based architecture, or any other appropriate architecture. The computing device may be appropriately programmed to implement the invention.

The system may be used to run a circuit design platform or software program, e.g. PathWave Advanced Design System (ADS) Software from Keysight or Cadence® Microwave Office® (MWO) circuit design software, which may be provided functions such as RF-aware device models, EM analysis, and design support aids for engineers who design integrated circuits. In addition, libraries of predefined electronic components and/or circuits, i.e. a combination of multiple components in certain arrangements, may be stored in the system such that when theses components are included in a newly designed circuit, these predefined circuits/components may be readily called from the library. Alternatively, other types of simulation software or platforms such as SPICE may be used.

For example, circuit design platform running on Apple IOS and Google Android as the similar example in the market may also be used. Preferably, this DSPSL circuit model may be applied and used in circuit design software for more accurate and faster simulations with other active and passive devices for radio frequency (RF)/microwave invention development. This can reduce the need to use multiple design environments.

As shown in FIG. 1 there is a shown a schematic diagram of a computer system or computer server 100 which is arranged to be implemented as an example embodiment of a system comprising computer-executable instructions, when being executed, arranged to perform a method for use in RF/EM circuit design. In this embodiment the system comprises a server 100 which includes suitable components necessary to receive, store and execute appropriate computer instructions. The components may include a processing unit 102, including Central Processing United (CPUs), Math Co-Processing Unit (Math Processor), Graphic Processing United (GPUs) or Tensor processing united (TPUs) for tensor or multi-dimensional array calculations or manipulation operations, read-only memory (ROM) 104, random access memory (RAM) 106, and input/output devices such as disk drives 108, input devices 110 such as an Ethernet port, a USB port, etc. Display 112 such as a liquid crystal display, a light emitting display or any other suitable display and communications links 114. The server 100 may include instructions that may be included in ROM 104, RAM 106 or disk drives 108 and may be executed by the processing unit 102. There may be provided a plurality of communication links 114 which may variously connect to one or more computing devices such as a server, personal computers, terminals, wireless or handheld computing devices, Internet of Things (IoT) devices, smart devices, edge computing devices. At least one of a plurality of communications link may be connected to an external computing network through a telephone line or other type of communications link.

The server 100 may include storage devices such as a disk drive 108 which may encompass solid state drives, hard disk drives, optical drives, magnetic tape drives or remote or cloud-based storage devices. The server 100 may use a single disk drive or multiple disk drives, or a remote storage service 120. The server 100 may also have a suitable operating system 116 which resides on the disk drive or in the ROM of the server 100.

The computer or computing apparatus may also provide the necessary computational capabilities to operate or to interface with a machine learning network, such as neural networks, to provide various functions and outputs. The neural network may be implemented locally, or it may also be accessible or partially accessible via a server or cloud-based service. The machine learning network may also be untrained, partially trained or fully trained, and/or may also be retrained, adapted or updated over time.

In accordance with a preferred embodiment of the present invention, there is provided an embodiment of the system for running an electrical circuit design platform, for example, when being executed, the system may perform a method for use in RF/EM circuit design. In this embodiment, the server 100 is used as part of a system as arranged to receive instructions from a user, such as a circuit designer, who may wish to design an RF/EM circuit including a DSPSL circuit component. In addition, when the new RF/EM circuit has been completely/successfully designed, the user may further evaluate the simulated performance of the circuit, e.g. by simulating a circuit performance of the RF/EM circuit including the DSPSL on the electrical circuit design platform, without having to run a separate program, such as an EM simulator to simulate an RF/EM component.

Preferably, the circuit design platform may also include a library or collection of computer implemented circuit component or circuit model. For example, a DSPSL model may be include in a computer-implemented circuit, and the DSPSL may operate together with other active and passive components in the RF/EM circuit, which is a simulated electrical circuit. Examples if RF/EM circuit which may include a DSPSL may include an in-phase power divider, an out-of-phase power divider, a bandpass filter, a rat-race hybrid circuit, and a DC biasing network, a push-pull amplifier and an oscillator. It should be appreciated by a skilled person in the field that other types of RF/EM circuit may also include the DSPSL component in accordance with various embodiments in this disclosure.

For example, the DSPSL may be included in an RF/EM circuit which may include other active components such as switches, transistors and other types of integrated circuits. On the other hand, passive components such as resistors, capacitors, inductors and diodes may be included, as appreciated by skilled person in the field.

The inventors devised that in circuit design, it may be necessary for the circuit designers have to use EM simulator to design the passive circuit and then import back to circuit software which is another design environment. With the new DSPSL model, it is possible to design and simulate a complete circuit in one environment (circuit design software/platform).

In one example operation, a circuit designer may utilize the electrical circuit design platform to design a new RF/EM circuit including a plurality of circuit components and RF modules such as a microstrip lines (MSL) or a DSPSL for exciting the RF/EM circuit. The circuit designer may conveniently compare the performance of the circuit with MSL or DSPSL as feeder structure, as well as different design parameters of the DSPSL structure, by performing simulation of whole RF/EM circuit including the feeder structure.

Figure 2:
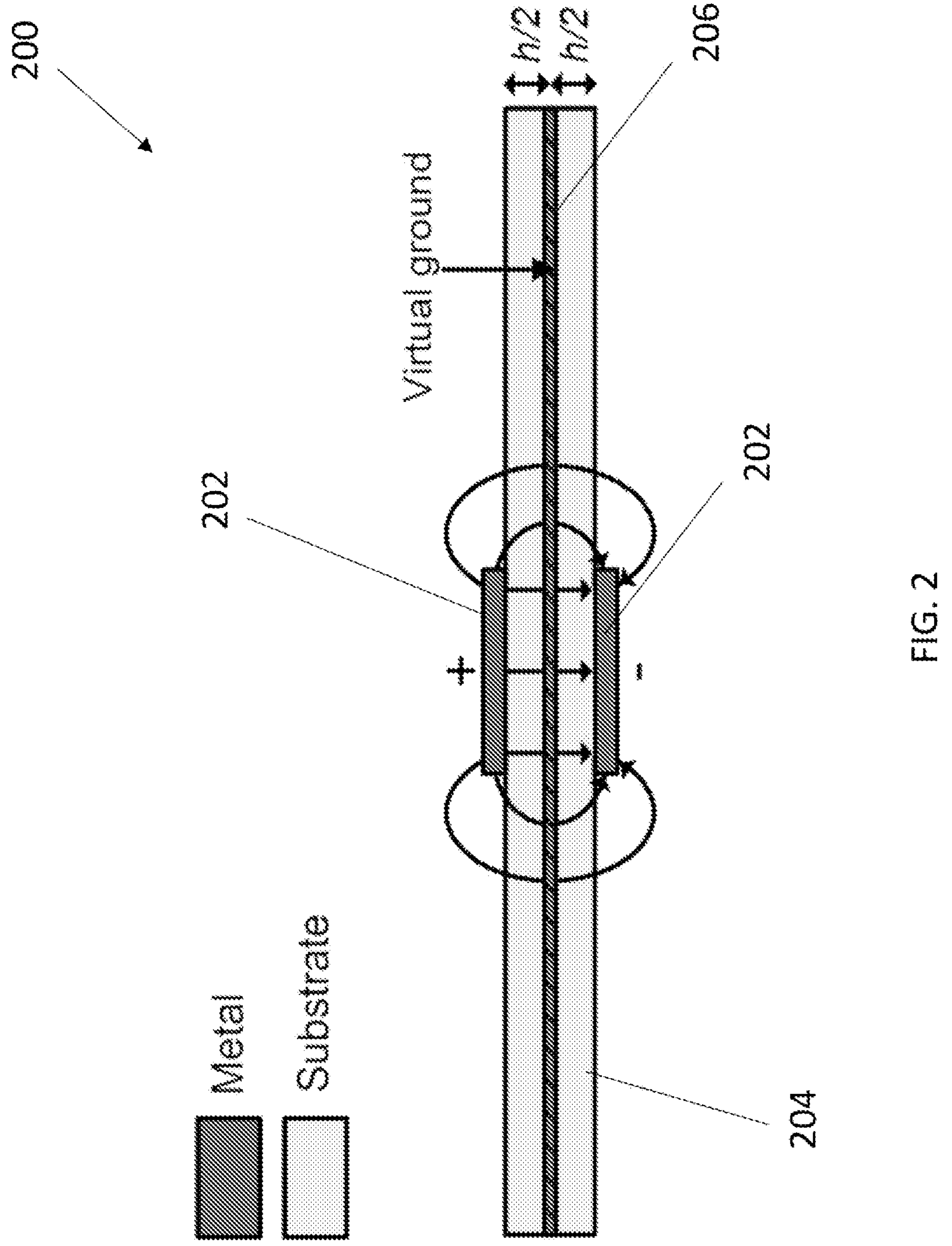
FIG. 2 is a cross-sectional diagram of a double-sided parallel-strip line (DSPSL) in accordance with an embodiment of the present invention.

With reference to FIG. 2, there is shown an example embodiment of a double-sided parallel-strip line (DSPSL) 200 having a balanced line arranged to reject external noise from connected circuit components when fed to other electrical circuits during operation of the RF/EM circuit, such as a balanced circuit; wherein the DSPSL 200 includes a pair of parallel-strip lines 202 of conducting plate disposed back-to-back on opposite sides of a substrate 204, such as an FR4 substrate. The DSPSL also includes a via across the substrate for connecting the pair of parallel-strip line defined on both sides of the substrate.

The inventors devised that DSPSL may include different ground plane structures. In one preferred embodiment, the DSPSL 200 comprises no ground plane, or a virtual ground plane, between the DSPSL or the parallel-strip lines. With reference to FIG. 2, there is shown a cross section of DSPSL 200, and in this example, there is a virtual ground plane 206 between two parallel-strip lines 202. This virtual ground plane 206 converts the DSPSL 200 into a combination of two identical MSLs placed back to back with the thickness of h/2.

Preferably, virtual ground plane 206 is defined at a mid-point of a dielectric separation between the pair of parallel-strip lines 202 of conducting plate. This virtual ground plane 206 forms the mirror plane so the bottom strip is like the mirror image of top strip. A typical transmission line is schematically represented as a two-wire line which is modelled as a lumped-element equivalent circuit shown in FIG. 3A while FIG. 4A represents the lumped-element equivalent circuit of DSPSL, i.e. i) R' and R" are series resistance per unit length; ii) L' and L" are series inductance per unit length; iii) G' and G" are shunt conductance per unit length and iv) C' and C" are shunt capacitance per unit length.

Figures 3A, 3B, 4A, 4B:
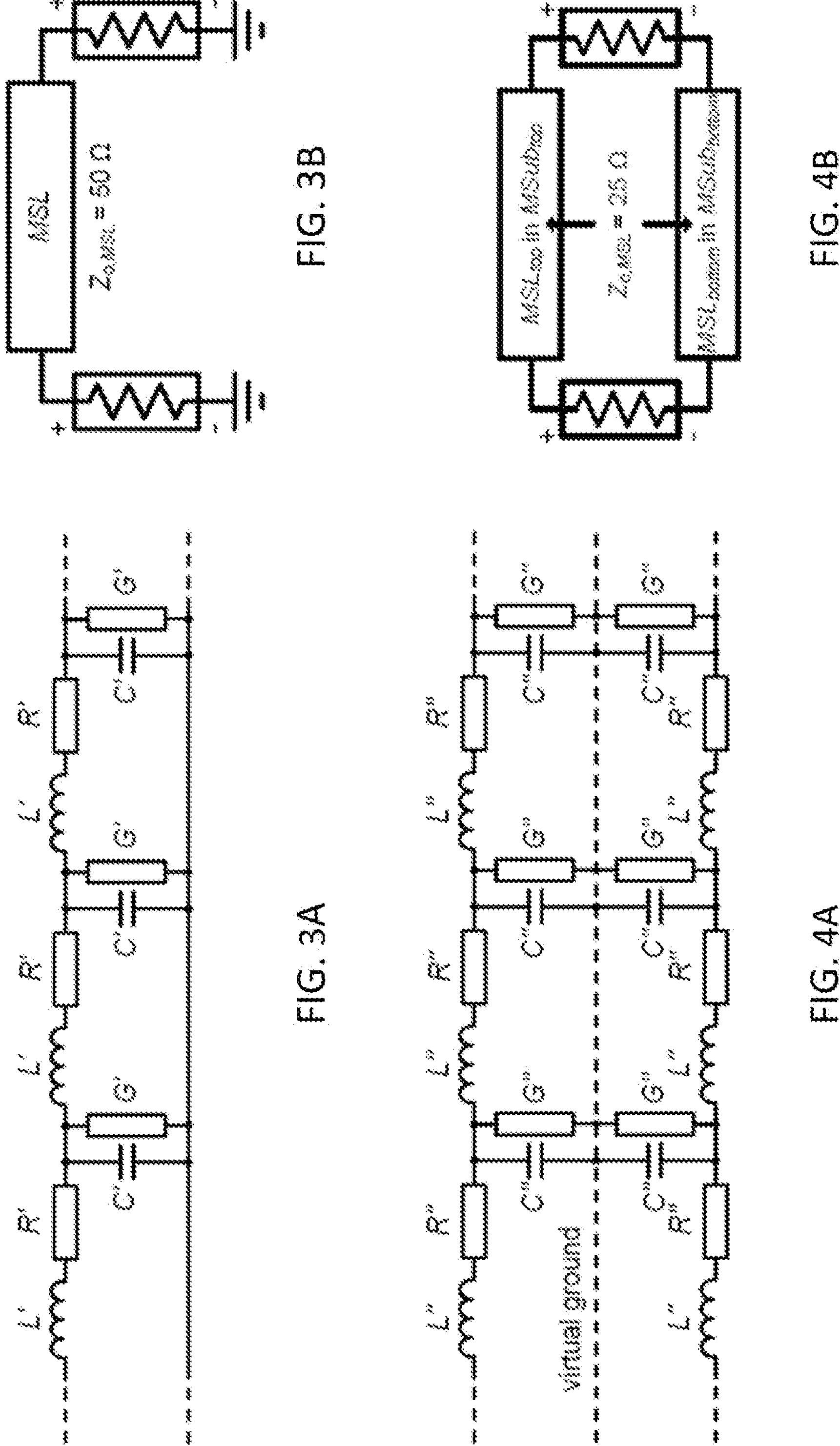
FIG. 3A is a diagram showing a lumped-element equivalent circuit of a Microstrip line (MSL).
FIG. 3B is a diagram showing a circuit model of a Microstrip line (MSL).
FIG. 4A is a diagram showing a lumped-element equivalent circuit of a Double-sided parallel-strip line (DSPSL).
FIG. 4B is a diagram showing a circuit model of a Double-sided parallel-strip line (DSPSL).

Since FIG. 3A can be used to represent the lumped-element equivalent circuit of MSL, the characteristic impedance of MSL, $Z_{o,MSL}$ is $$Z_{o,MSL} = 2 \times \sqrt{\frac{R' + j\omega L'}{G' + j\omega C}} \tag{1}$$

FIG. 3B also shows the MSL circuit model and the $Z_{o,MSL}$ is 50Ω. Two ends of MSL are terminated with 50Ω to the ground matching on both sides. Since the DSPSL is a combination of two identical MSLs placed back to back, for the same strip width, the characteristic impedance of DSPSL, $Z_{o,DSPSL}$ with dielectric separation h is twice that of a MSL with dielectric thickness h/2. From the lumped-element equivalent circuit in FIG. 4A, the circuit model of DSPSL is related to that of MSL so the $Z_{o,DSPSL}$ becomes $$Z_{o,DSPSL} = 2 \times \sqrt{\frac{R'' + j\omega L''}{G'' + j\omega C''}} \tag{2}$$

In FIG. 4B, two MSLs ($MSL_{top}$ and $MSL_{bottom}$) with characteristic impedance equal to 25Ω form the DSPSL with $Z_{o,DSPSL}$ equal to 50Ω in FIG. 2, which is calculated from (1) for MSL in one side of DSPSL and then use (2) to find $Z_{o,DSPSL}$. They are connected and terminated with 50Ω to match on both sides. In the circuit model in FIG. 4B, two individual but identical substrates, $MSub_{top}$ and $MSub_{bottom}$ may be used and defined as $MSL_{top}$ and $MSL_{bottom}$ respectively. The ground plane of two MSL circuit models acts as the virtual ground plane of DSPSL in FIG. 2. In MSL circuit model, this plane is infinite ground plane. Therefore, the DSPSL circuit model is formed by the MSL circuit model and $MSL_{bottom}$ is like the mirror image of $MSL_{top}$ in FIG. 2.

Figures 5A, 5B:
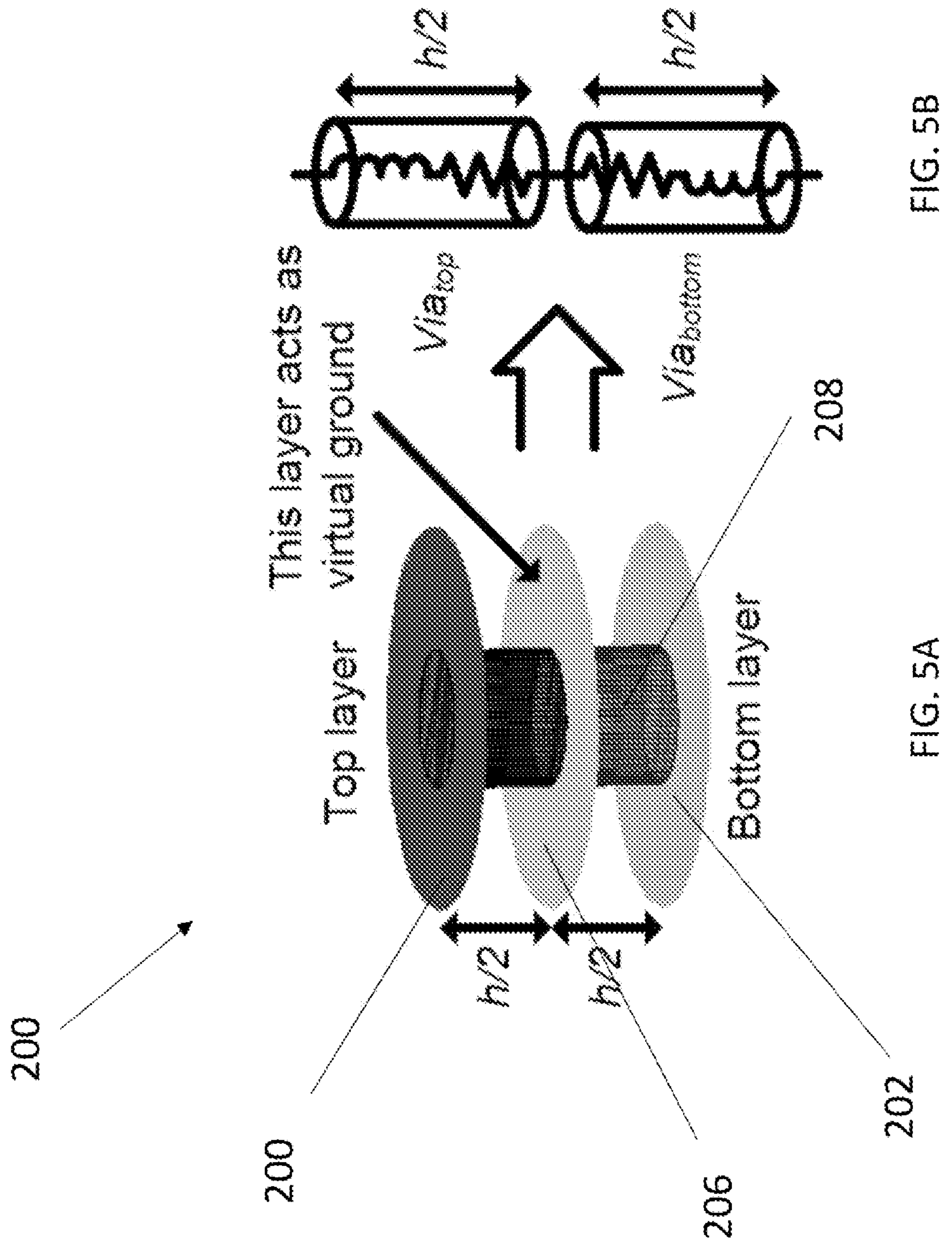
FIG. 5A is a diagram showing a three-dimensional view of via in DSPSL.
FIG. 5B is a diagram showing a circuit model of via in DSPSL.

Referring to FIG. 5A, there is shown a three-dimensional view of via 208 in DSPSL 200 which is used to connect the top and bottom layers (strips) 202. The circuit model of via in DSPSL 200 is also shown in FIG. 5B. This model is formed by two identical vias 208 from the MSL circuit model. $Via_{bottom}$ is like the mirror image of $Via_{top}$. One side of $Via_{top}$ is assigned to top layer and one side of $Via_{bottom}$ is assigned to bottom layer. The remaining sides of two vias 208 are assigned to a new layer as virtual ground so that the top and bottom layers are, connected by this vias 208 in DSPSL 200.

In one example embodiment, a DSPSL was simulated and then fabricated on double-layer FR4 substrate with dielectric constant of 4.3 and total thickness of 1.2 mm and other parameters can be found in Table I below. The width and length of the DSPSL used were 3.15 mm and 80 mm respectively. The width used is equivalent to $Z_{o,TL}$ equal to 25Ω in FIG. 3(*b*). Circuit design software, e,g, PathWave Advanced Design System (ADS) Software from Keysight/Cadence® Microwave Office® circuit design software was used for circuit model and EM simulations.

TABLE I

SUBSTRATE'S PARAMETERS USED IN MSL CIRCUIT MODEL

| Parameters | MSL substrates: MSubtop | MSL substrates: MSubbottom |
|---|---|---|
| Substrate thickness | 0.6 mm | |
| Dielectric constant | 4.3 | |
| Strip thickness | 35 μm | |
| Loss tangent | 0.02 | |
| Cond1Layer (for strip line) | Top | Bottom |

Figure 6:
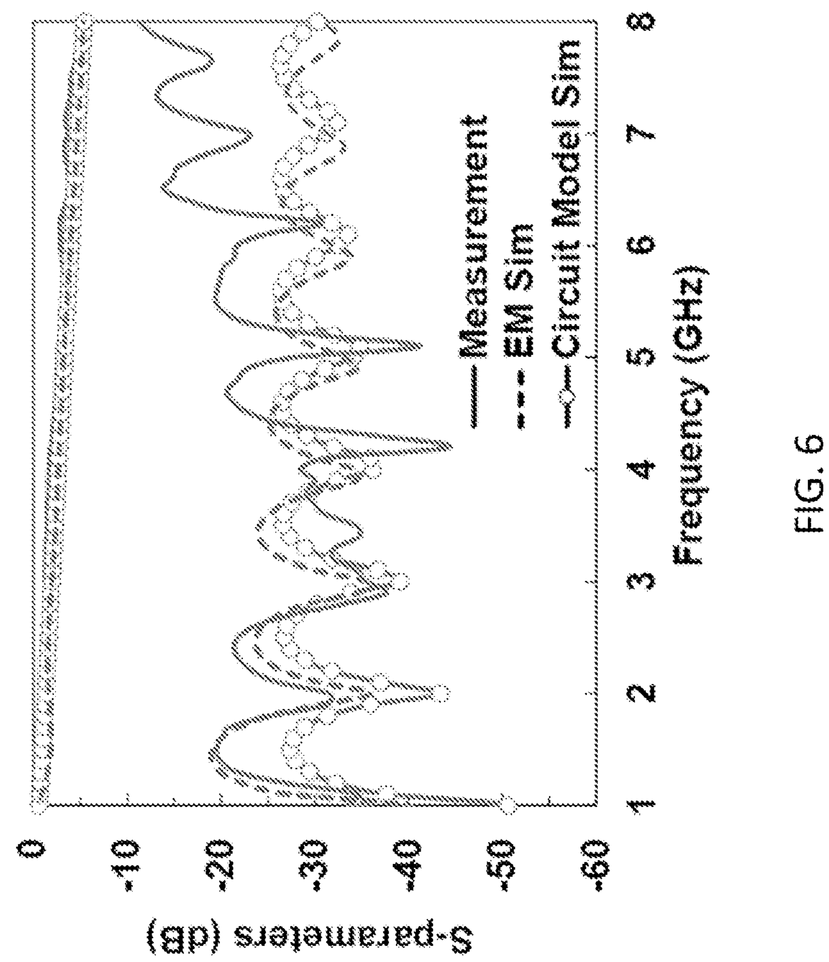
FIG. 6 is a plot showing S-parameters (S11 and S21) of a DSPSL.

With reference to FIG. 6, there is provided a plot showing the S-parameters of this DSPSL and it shows that the return losses and insertion losses of measurement, circuit model and EM simulations are close to each other. The difference at high frequency between measurement and simulations is due to the FR4 substrate. When the circuit model of DSPSL is used in passive circuit design, the same odd-mode and even-mode analysis can be used to extract the circuit parameters for the initial design.

As described earlier in this disclosure, DSPSL may be included in various RF/EM circuits, including a rat-race hybrid. In one example embodiment, with reference to FIGS. 7-10, a DSPSL rat-race hybrid was designed and fabricated on double-layer FR4 substrate with dielectric constant of 4.3 and total thickness of 1.2 mm. The circuit design software was used for circuit model simulation. Some important parameters used in the substrates and vias are shown in Table I and II respectively.

TABLE II

VIA'S PARAMETERS USED IN MSL CIRCUIT MODEL

| Parameters | MSL vias: $Via_{top}$ | MSL vias: $Via_{bottom}$ |
|---|---|---|
| Substrate thickness | 0.6 mm | |
| Cond1Layer | Top | Bottom |
| Cond2Layer | Virtual ground | |

Figures 7, 8, 9, 10:
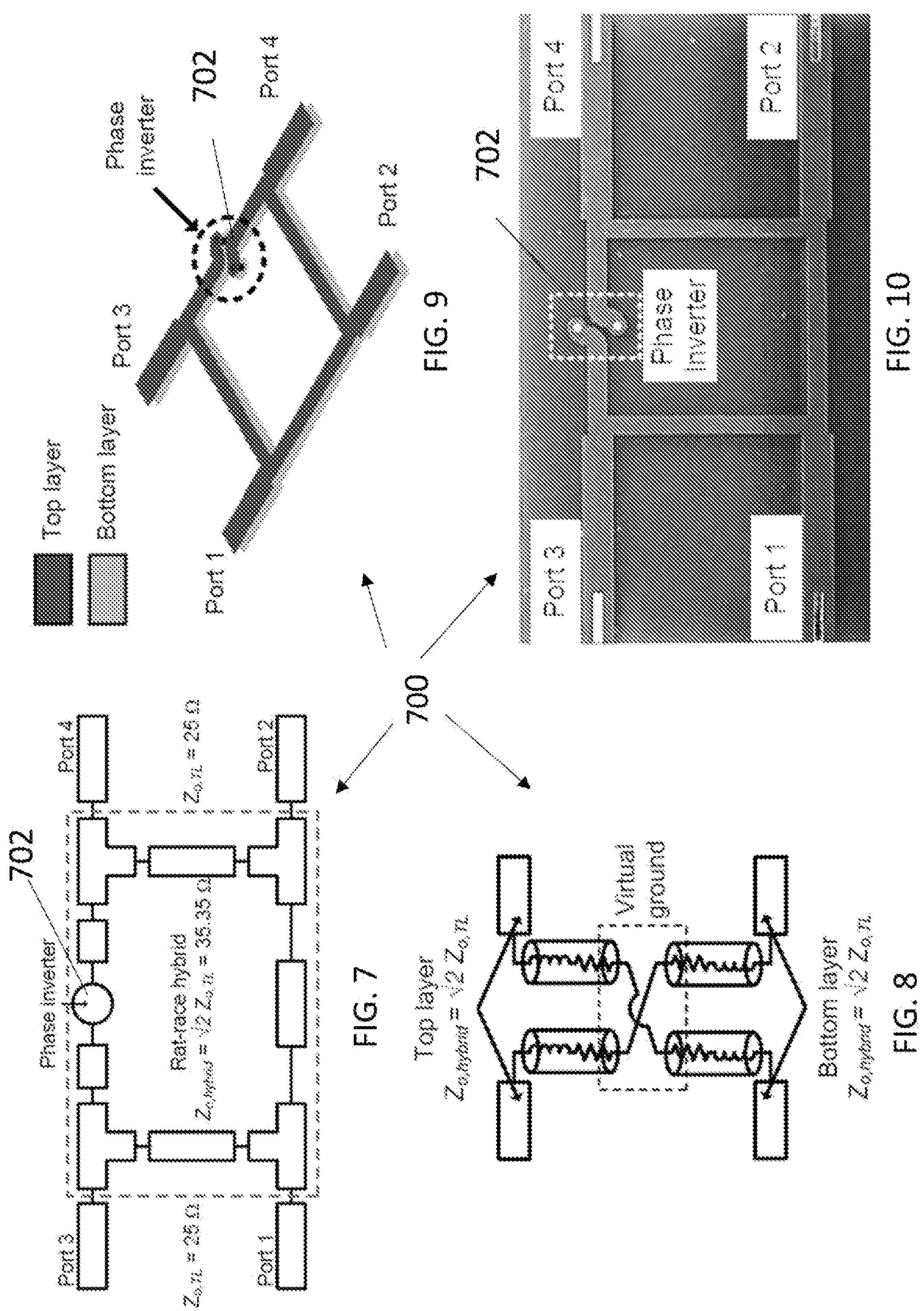
FIG. 7 is a diagram showing a MSL circuit model used in top and bottom layers of double-sided parallel-strip rat-race hybrid.
FIG. 8 is a diagram showing a circuit Model of a phase invertor.
FIG. 9 is a three-dimensional view and layout of the rat-race hybrid.
FIG. 10 is a photograph of the fabricated circuit's top layer (bottom layer).

In this example, two substrates were defined with thickness of 0.6 mm. With reference to FIG. 7, the MSL circuit model used in top and bottom layers of wideband DSPSL rat-race hybrid 700. The characteristic impedance of this MSL circuit model in rat-race hybrid 700 is $\sqrt{2}\,Z_{o,TL}$ in FIG. 7 which is half of that in conventional microstrip rat-race hybrid. The width of rat-race hybrid used in FIG. 7 is 1.95 mm and that of transmission line connecting to the ports is 3.14 mm, which are equivalent to characteristic impedance equal to 35.35Ω ($Z_{o,hybrid}$) and 25Ω ($Z_{o,TL}$) respectively. The step-in width model is not included in FIG. 7, which is used in the transition between rat-race hybrid 700 and transmission line. The phase inverter 702 together with the 90° line completely replaces the conventional 270° line in the hybrid 700. This phase inverter 702 was designed by the circuit model in FIG. 8. Phase inverters 702 may provide a wideband 180° phase shift by reversing the signal and ground lines in MSL in FIG. 3A while the positive and negative signal lines are reversed in DSPSL in FIG. 4A. FIGS. 7 and 8 form the wideband DSPSL rat-race hybrid 700 by combining top and bottom layers and the bottom layer is like the mirror image of top layer, which is shown in the three-dimensional view in FIG. 9.

Figures 11, 12, 13, 14:
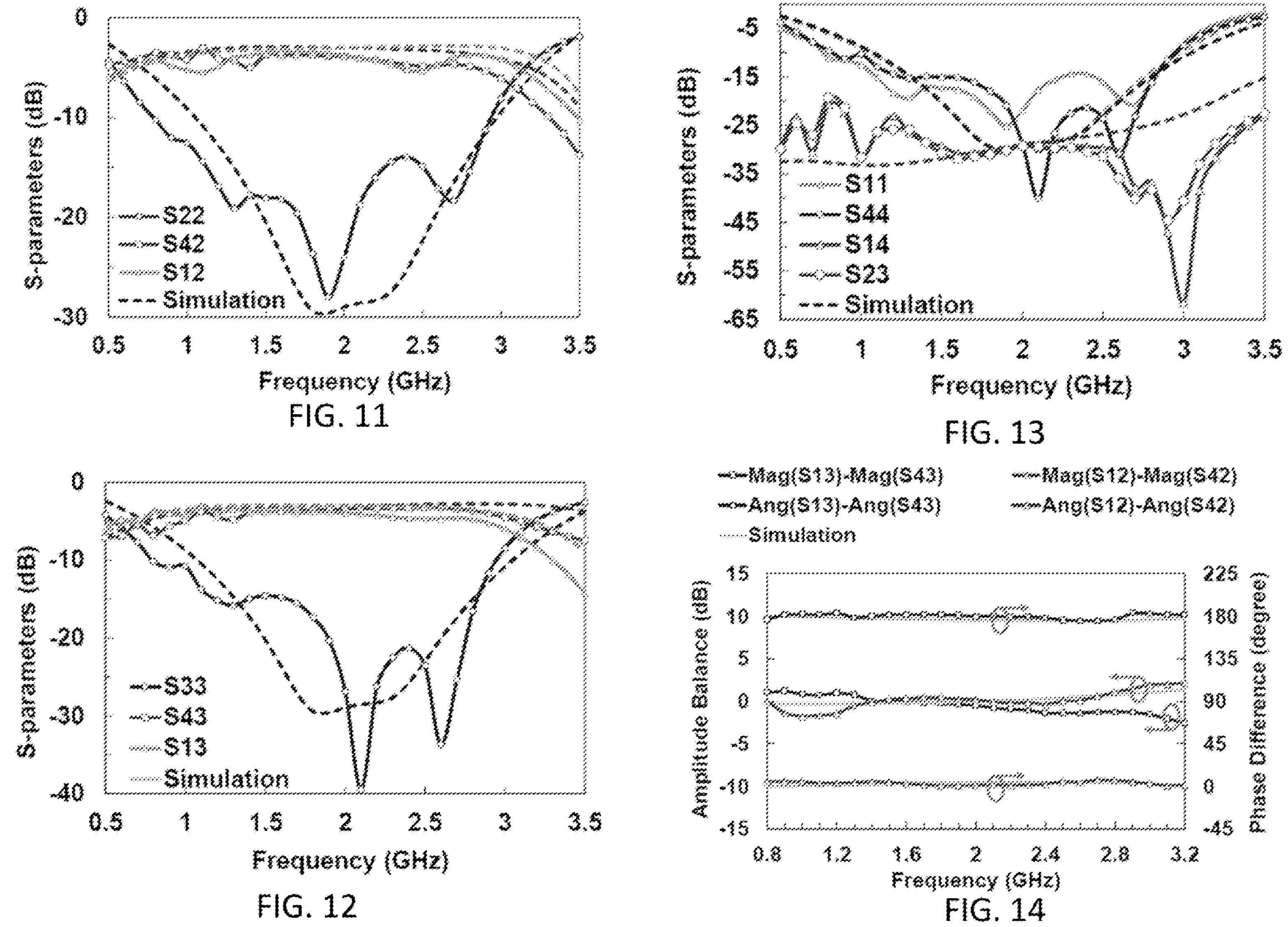
FIG. 11 is a plot showing simulated and measured results with the port 2 excitation.
FIG. 12 is a plot showing simulated and measured results with the port 3 excitation.
FIG. 13 is a plot showing simulated and measured results of return loss and isolation.
FIG. 14 is a plot showing simulated and measured results of amplitude balance and phase difference between port 1 and port 4 with port 2 and port 3 excitation respectively.

With reference to FIG. 10, there is shown a fabricated rat-race hybrid 700, which has wideband performance as well as size reduction compared to the conventional rat-race hybrid. The top and bottom sides of the fabricated hybrid 700 are the same like in FIG. 9. Port 2 and port 3 are the sum port and difference port respectively. FIGS. 11 and 12 show the simulated and measured results when the signal is excited at these ports respectively. FIGS. 11 to 13 show that the return losses for all ports and the insertion losses are found to be better than 10 dB and 3 dB±1.5 dB respectively from 0.8 GHz to 3.2 GHZ. The isolation (S14 and S23) is more than 25 dB shown in FIG. 13 in this frequency range.

Referring to FIG. 14, there is shown the simulated and measured amplitude balances and phase differences between the in-phase and out-of-phase signal at port 1 and port 4. It shows that both phase differences are within 5° from 0.8 GHz to 3.2 GHz while both amplitude balances are within 3 dB in the same frequency range. In Table III, compared to the conventional rat-race hybrid and other examples with phase inverter, the rat-race hybrid's bandwidth is increased to 120% and this hybrid 700 achieves similar performance to the same structure of DSPSL in other example and gives better performance than others. Since the phase inverter together with the 90° line completely replaces the conventional 270° line in the hybrid, this replacement also gives significant in the size reduction.

TABLE III

PERFORMANCE COMPARISON BETWEEN HYBRIDS

| | Port | Output (dB) | Freq. range (GHz) | BW (%) | Phase balance (degree) | Return loss (dB) | Isolation (dB) |
|---|---|---|---|---|---|---|---|
| Example 1 | Sum | 3 ± 1 | 1.6-2.4 | 40 | +/−10° | >15 | >15 |
| | Diff. | | 1.7-2.3 | 30 | | | |
| Example 2 | Sum | 3 ± 1 | 0.8-3.2 | 120 | +/−5° | >10 | >25 |
| | Diff. | | 0.8-3.2 | 120 | | | |
| Example 3 | Sum | 3 ± 1 | 1.4-2.5 | 56.4 | +/−5° | >10 | >20 |
| | Diff. | | 1.6-2.6 | 60 | | | |
| Example 4 | Sum | 3 ± 1 | 1.2-2.8 | 80 | +/−5° | >10 | >20 |
| | Diff. | | 1.2-2.8 | 80 | | | |
| This invention | Sum | 3 ± 1 | 0.8-3.2 | 120 | +/−5° | >10 | >25 |
| | Diff. | | 0.8-3.2 | 120 | | | |

Figures 15, 16, 17, 18:
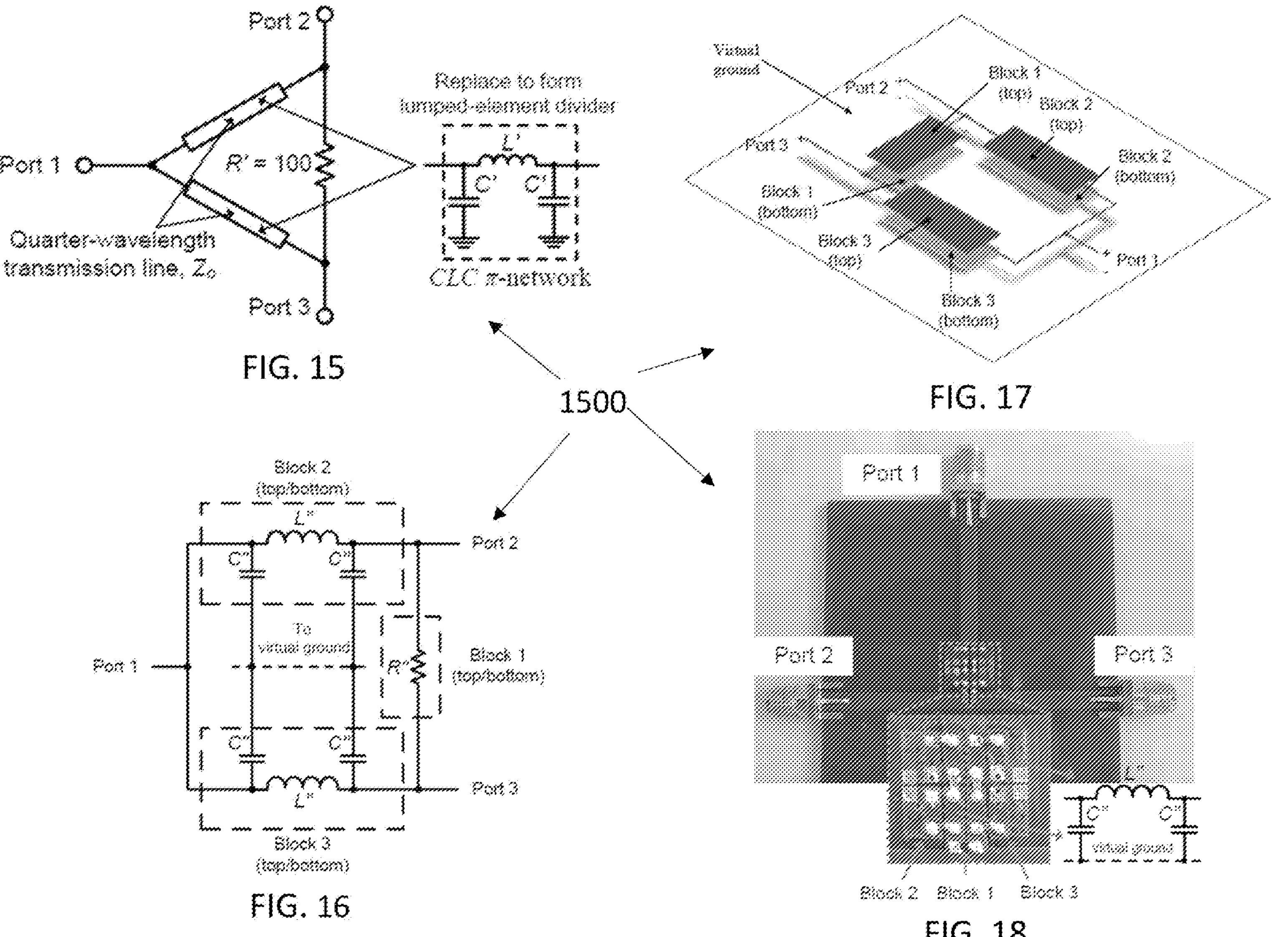
FIG. 15 is a circuit diagram of the two-way conventional Wilkinson divider and CLC π-network as quarter-wavelength transmission line replacement.
FIG. 16 is a schematic diagram of the lumped-element DSPSL Wilkinson divider of top and bottom sides.
FIG. 17 is a three-dimensional view and layout of the lumped-element DSPSL Wilkinson divider.
FIG. 18 is a photograph of the fabricated circuit's top layer (bottom layer).

In another example embodiment, the DSPSL may be included in a Wilkinson divider 1500, referring to FIG. 15, and the size of this divider 1500 is limited by two quarter-wave transmission lines, which is very long and its characteristic impedance $Z_o$ used is normally 70.7Ω. To further reduce size, the lumped-elements are used to form two microwave impedance transformers (CLC π-network) which were used to replace two quarter-wave transmission lines in the divider shown in FIG. 14. These element values of CLC π-network are found by the following equations:

$$C' = \frac{1}{2\pi f Z_o} \tag{3}$$

$$L' = \frac{Z_o}{2\pi f} \tag{4}$$

In this example DSPSL Wilkinson divider 1500, the top and bottom layers are the same shown in FIG. 16. In this example, the lumped-elements are grouped into three blocks in the circuit (Block 1, Block 2 and Block 3). FIG. 17 shows the three-dimensional view of DSPSL Wilkinson divider 1500 which combines FIG. 16 to be top and bottom layers of divider and the Block 1, 2 and 3 at the bottom is designed like the mirror image of Block 1, 2 and 3 at the top. There is a virtual ground plane between top and bottom layers like in FIG. 4. This DSPSL divider 1500 was designed on double-layer FR4 substrate with dielectric constant of 4.3 and total thickness of 1.2 mm and the operating frequency is designed at 1.9 GHZ. Therefore, (3) and (4) become, $$C'' = \frac{C'}{2} = \frac{1}{4\pi f Z_o} \tag{5}$$

$$L'' = \frac{L'}{2} = \frac{Z_o}{4\pi f} \tag{6}$$

$$R'' = \frac{R'}{2} = 50 \tag{7}$$

At 1.9 GHZ, using (5) and (6), C"=2.2 pF and L"=2.7 nH were obtained and these values were used in circuit design software for simulation. In the fabrication, since the component's pads and connection between components are the transmission line and there is the parasitic effect on inductors and capacitors, circuit model in FIG. 4B and library from Murata was used respectively. Finally, Murata GRM Series capacitors, 2.2 pF, Murata LQP Series inductors, 1.8 nH, and general resistor, 51Ω were used in final simulation and fabrication. FIG. 18 shows the picture of the fabricated divider that the top and bottom sides are the same. Block 1 (resistor), Block 2 (CLC π-network) and Block 3 (CLC π-network) are also shown in FIG. 18.

Figures 19, 20:
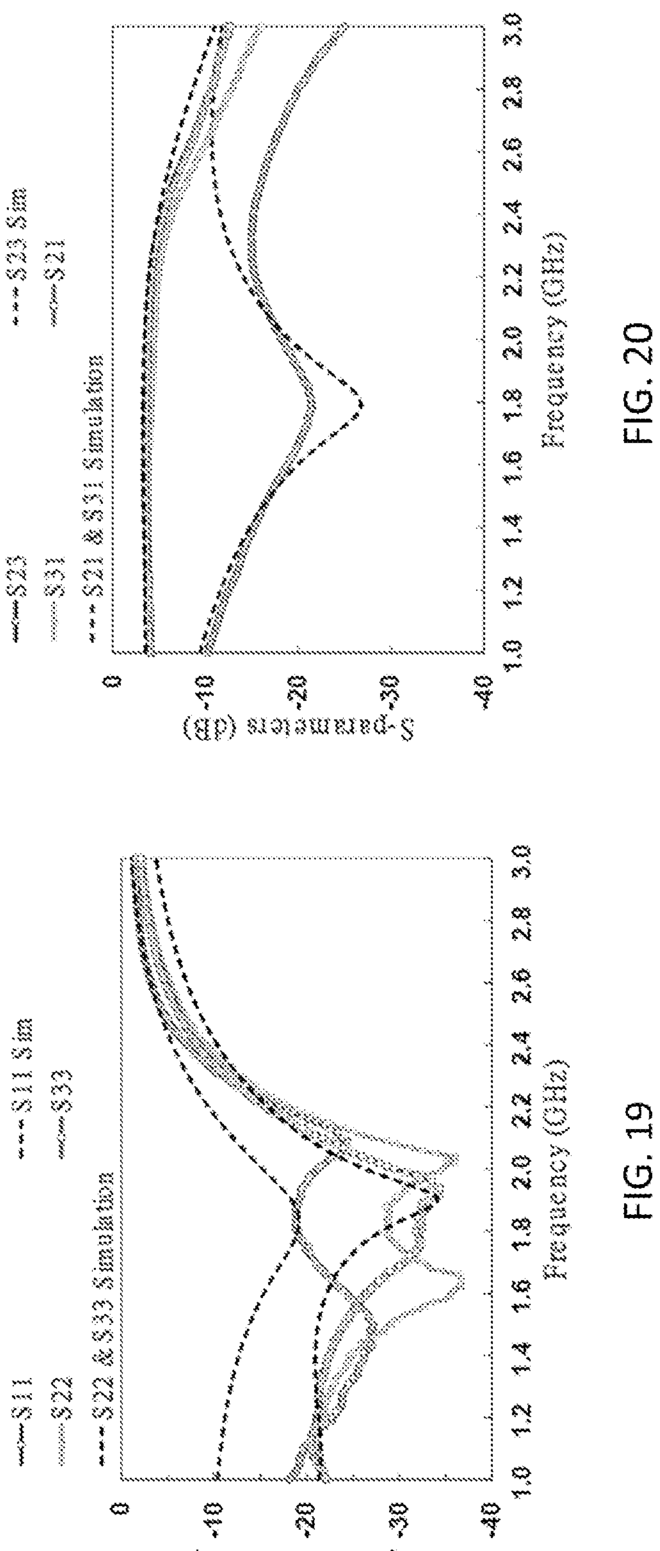
FIG. 19 is a plot showing simulated and measured results of S-parameters.
FIG. 20 is a plot showing simulated and measured results of S-parameters.

With reference to FIG. 19, it is observed that the return losses for all ports are better than 10 dB from 1.6 GHz to 2.2 GHz. The insertion losses and isolation are also shown in FIG. 20. The insertion losses are around 3 dB and isolation is better than 15 dB from 1.6 GHz to 2.2 GHz. The experiment results are close to the simulation when the lumped-elements are used in the circuit model for DSPSL Wilkinson divider's simulation. The increase in insertion loss at high frequency in FIG. 20 is due to the extra loss of FR4 substrate and lumped-elements. High frequency substrate and lumped-elements with high quality-factor can be used to provide lower insertion loss at high frequency.

These embodiments may be advantageous that, DSPSL circuit model is formed by the MSL circuit model and the principle of this model is provided. Advantageously, the DSPSL circuit model may be used to design RF/EM circuits, such as wideband rat-race hybrid with the phase inverter and lumped-element Wilkinson divider. Both circuits are in the structure of DSPSL. The experimental results show that it is close to the simulation with size reduction in both designs as well as wide bandwidth shown in the rat-race hybrid with phase inverter.

In an alternative embodiment, instead of having no ground plane or a virtual ground plane, the DSPSL further comprises an inserted conductor plane at a mid-point of a dielectric separation between the pair of parallel-strip lines of conducting plate.

n this example, offset DSPSL and DSPSL with an inserted conductor plane is provided, which may be further referred as a "modified DSPSL" below. This inserted conductor plane separates the DSPSL into two networks with the characteristic impedance, Zo equal to 25Ω. Oscillator, antenna, divider take this advantage of high flexibility in the design and its applications. Preferably, embodiments of a circuit model for DSPSL with an inserted conductor plane are provided. This model includes microstrip line (MSL) circuit model, therefore, it is simple and gives accurate and faster simulation in the design and it can be implemented in circuit design software with other RF/microwave components, thus a circuit designer may simulate a circuit performance of the RF/EM circuit including the DSPSL on the electrical circuit design platform without using an electromagnetic (EM) simulator.

Advantageously, individual electromagnetic (EM) simulation on the circuit, therefore, can be eliminated. Based on this new circuit model, simple open stub passive circuits were simulated, fabricated, and tested to demonstrate this accurate circuit model. The design methodology and experimental results are further described as follows. Results show that it gives close to simulation results.

Figures 21, 22, 23:
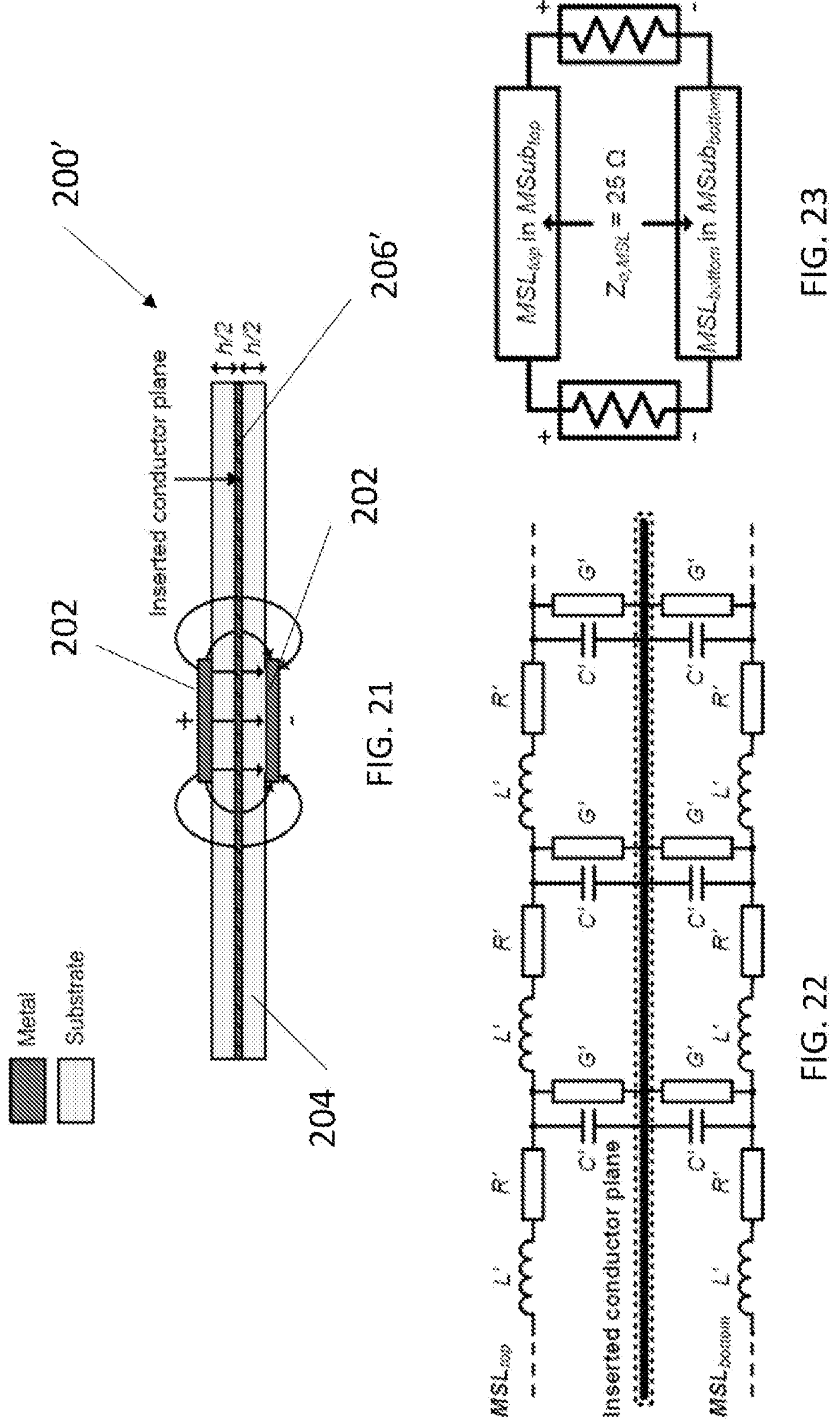
FIG. 21 is a diagram showing a cross section of double-sided parallel-strip line (DSPSL) with an inserted conductor plane in accordance with an embodiment of the present invention.
FIG. 22 is a diagram showing a lumped-element equivalent circuit of DSPSL with an inserted conductor plane.
FIG. 23 is a diagram showing a circuit model of DSPSL with an inserted conductor plane.

With reference to FIG. 21, there is shown an example embodiment of a modified DSPSL 200' having an inserted conductor plane 206'. As shown in the cross-section view, the inserted conductor plane 206' is at the same position as the virtual ground plane 206 between two parallel-strip lines in DSPSL 200. This conductor plane 206' converts the DSPSL 200' into a combination of two identical MSLs and becomes the common ground plane of two MSLs with each thickness of h/2.

With reference to FIG. 22, the lumped-element equivalent circuit of this DSPSL 200' with an inserted conductor plane 206' is shown. Two identical MSLs, $MSL_{top}$ and $MSL_{bottom}$ in FIG. 22 represent the top and bottom of two identical MSLs placed back to back in FIG. 22 and the characteristic impedance of $MSL_{top}$ and $MSL_{bottom}$, $Z_o$ is $$Z_o = 2 \times \sqrt{\frac{R' + j\omega L'}{G' + j\omega C'}} \tag{8}$$

This lumped-element equivalent circuit in FIG. 22 is represented by circuit model with two identical MSLs in FIG. 23. The ground plane of two MSLs in FIG. 23 represents the inserted conductor plane in FIG. 22 and the $Z_o$ of both MSLs is equal to 25Ω. The DSPSL circuit model, therefore, was formed by the MSL circuit model, which is exactly the same circuit shown in FIG. 22.

Figures 24, 25:
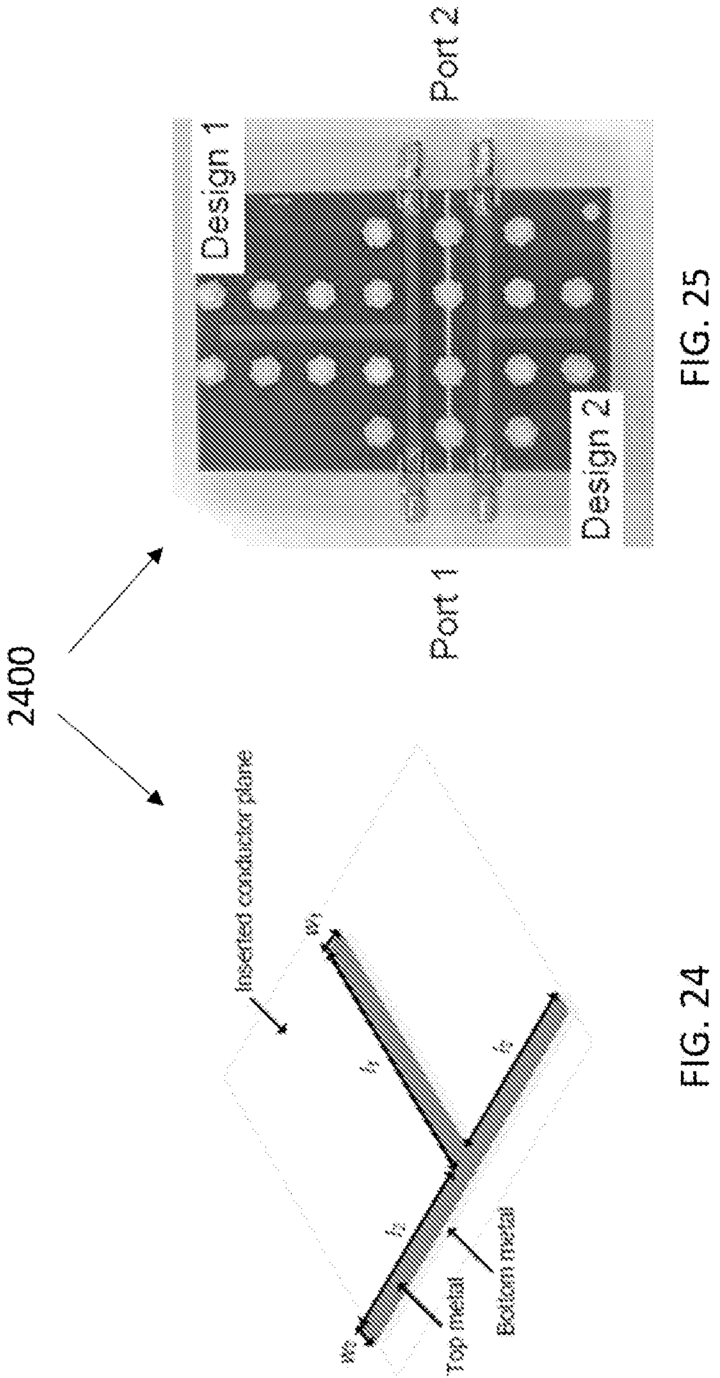
FIG. 24 is a three-dimensional view of open stub of DSPSL with an inserted conductor plane.
FIG. 25 is an image showing fabricated circuits of two designs of DSPSL with different dimensions.

An open stub of DSPSL 200' with the inserted conductor plane 206' was used for verification. This open stub used is a common structure to generate a transmission zero. Two designs were simulated and fabricated. Design 1 is with lower frequency of the transmission zero at 1 GHz and design 2 is with higher frequency of the transmission zero at 2 GHz. FIG. 24 and Table IV below show the dimension used in two designs, which the longer stub was used in low frequency.

TABLE IV

DIMENSION USED IN DESIGN 1 AND 2 IN FIG. 24

| | Design 1 (mm) | Design 2 (mm) |
|---|---|---|
| w1 | 3.0 | 3.0 |
| w2 | 2.5 | 2.5 |
| l1 | 40 | 20 |
| l2 | 20 | 15 |

Figures 26, 27:
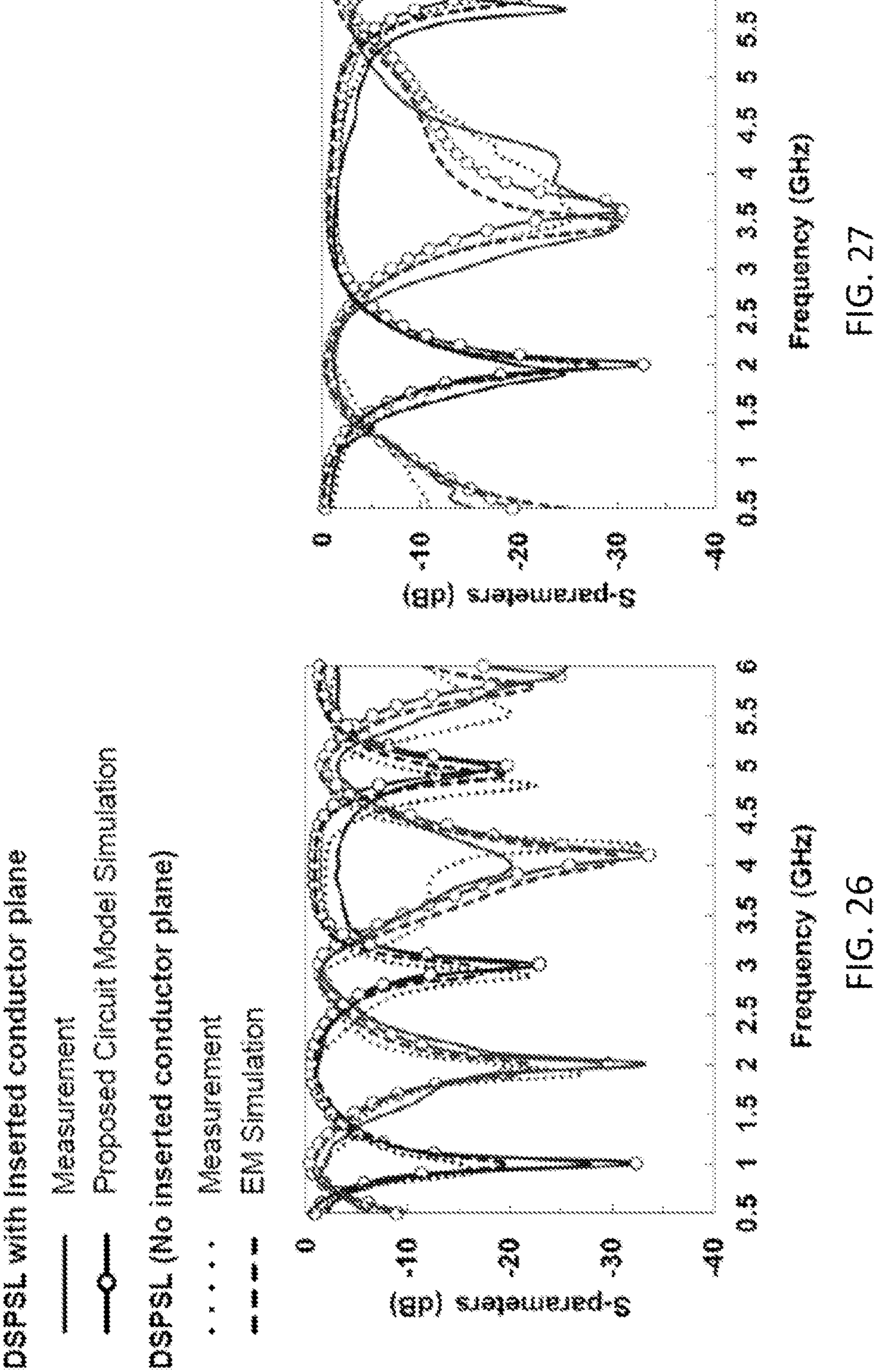
FIG. 26 is a plot showing simulated and measured S-parameters (S11 and S21) of design 1.
FIG. 27 is a plot showing simulated and measured S-parameters (S11 and S21) of design 2.

The three-dimensional view of this open stub of DSPSL 200' with an inserted conductor plane 206' is shown in FIG. 24. The fabricated circuits 2400 of design 1 and 2 are also shown in FIG. 25, which were implemented on FR4 substrate with dielectric constant of 4.3 and total thickness of 1.2 mm. Circuit design software, PathWave Advanced Design System (ADS) Software from Keysight was used to implement this circuit model. Both designs with and without the inserted conductor plane were also fabricated for comparison. EM simulation on the typical DSPSL circuit was used to compare the design with the inserted plane. Simulated and measured results of design 1 and design 2 are shown in FIG. 26 and FIG. 27 respectively, which the return losses and insertion losses are presented. In this example, the circuit model used for simulation of DSPSL 200' with inserted conductor plane 206' is close to experimental results as well as the EM simulation of DSPSL circuit 200 without the inserted conductor plane.

Advantageously, embodiments of a circuit model for DSPSL with an inserted conductor plane are provided. This circuit model is simple and easy to implement with other active and passive circuits. The open stub circuits were used for verification. The experimental results show that it is close to the simulation, therefore, other designs are also easily applied by this model.

In addition, the new method allows the elimination of using an EM simulator in the circuit design phase, therefore reducing the design/optimization time and the risk of potential operation mistakes by eliminating the need to use multiple design environments.

Although not required, the embodiments described with reference to the figures can be implemented as an application programming interface (API) or as a series of libraries for use by a developer or can be included within another software application, such as a terminal or personal computer operating system or a portable computing device operating system. Generally, as program modules include routines, programs, objects, components and data files assisting in the performance of particular functions, the skilled person will understand that the functionality of the software application may be distributed across a number of routines, objects or components to achieve the same functionality desired herein.

It will also be appreciated that where the methods and systems of the present invention are either wholly implemented by computing system or partly implemented by computing systems then any appropriate computing system architecture may be utilized. This will include tablet computers, wearable devices, smart phones, Internet of Things (IoT) devices, edge computing devices, stand alone computers, network computers, cloud-based computing devices and dedicated hardware devices. Where the terms "computing system" and "computing device" are used, these terms are intended to cover any appropriate arrangement of computer hardware capable of implementing the function described.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. An electrical circuit component for an RF/EM circuit, comprising a double-sided parallel-strip line (DSPSL) having a balanced line arranged to reject external noise from connected circuit components when fed to other electrical circuits during operation of the RF/EM circuit; wherein the DSPSL includes a pair of parallel-strip lines of conducting plate disposed back-to-back on opposite sides of a substrate, wherein the electrical circuit component is configured to be simulated on an electrical circuit design platform without using an electromagnetic (EM) simulator by utilizing a lumped-element equivalent circuit model; and wherein said lumped-element equivalent circuit model utilizes a ground plane defined at a mid-point of a dielectric separation between the pair of parallel-strip lines to decompose the DSPSL into two equivalent microstrip line (MSL) networks.

2. The electrical circuit component in accordance with claim 1, wherein the DSPSL is provided as a computer-implemented circuit component for use on an electrical circuit design platform.

3. The electrical circuit component in accordance with claim 2, wherein the DSPSL is arranged to operate together with other active and passive components in the RF/EM circuit, wherein the RF/EM circuit is a simulated electrical circuit.

4. The electrical circuit component in accordance with claim 3, wherein the RF/EM circuit includes an in-phase power divider, an out-of-phase power divider, a bandpass filter, a rat-race hybrid circuit, and a DC biasing network, a push-pull amplifier and an oscillator.

5. The electrical circuit component in accordance with claim 3, wherein the RF/EM circuit includes a balanced circuit, and the pair of parallel-strip lines are electrically connected by a via across the substrate.

6. The electrical circuit component in accordance with claim 5, wherein the DSPSL comprises a virtual ground plane between the DSPSL.

7. The electrical circuit component in accordance with claim 6, wherein the DSPSL comprises no physical ground planes.

8. The electrical circuit component in accordance with claim 7, wherein the virtual ground plane is defined at a mid-point of a dielectric separation between the pair of parallel-strip lines of conducting plate.

9. The electrical circuit component in accordance with claim 5, wherein the DSPSL further comprising an inserted conductor plane at a mid-point of a dielectric separation between the pair of parallel-strip lines of conducting plate.

10. A method for use in RF/EM circuit design, comprising the step of: including a double-sided parallel-strip line (DSPSL) as an electrical circuit component having a balanced line arranged to reject external noise from connected circuit components when fed to other electrical circuits during operation of an RF/EM circuit; wherein the DSPSL includes a pair of parallel-strip lines of conducting plate disposed back-to-back on opposite sides of a substrate, wherein the method further comprises simulating a circuit performance of the RF/EM circuit including the DSPSL on an electrical circuit design platform without using an electromagnetic (EM) simulator by utilizing a lumped-element equivalent circuit model;

wherein said lumped-element equivalent circuit model utilizes a ground plane defined at a mid-point of a dielectric separation between the pair of parallel-strip lines to decompose the DSPSL into two equivalent microstrip line (MSL) networks for simulation.

11. The method in accordance with claim 10, wherein the DSPSL is provided as a computer-implemented circuit component for use on an electrical circuit design platform.

12. The method in accordance with claim 11, wherein the DSPSL is arranged to operate together with other active and passive components in the RF/EM circuit, wherein the RF/EM circuit is a simulated electrical circuit.

13. The method in accordance with claim 12, wherein the RF/EM circuit includes an inphase power divider, an out-of-phase power divider, a bandpass filter, a rat-race hybrid circuit, and a DC biasing network, a push-pull amplifier and an oscillator.

14. The method in accordance with claim 12, wherein the RF/EM circuit includes a balanced circuit and the pair of parallel-strip lines are electrically connected by a via across the substrate.

15. The method in accordance with claim 14, wherein the DSPSL comprises a virtual ground plane between the DSPSL.

16. The method in accordance with claim 15, wherein the DSPSL comprises no physical ground planes.

17. The method in accordance with claim 16, wherein the virtual ground plane is defined at a mid-point of a dielectric separation between the pair of parallel-strip lines of conducting plate.

18. The method in accordance with claim 14, wherein the DSPSL further comprising an inserted conductor plane at a mid-point of a dielectric separation between the pair of parallel-strip lines of conducting plate.

19. An electrical circuit design platform comprising computer-executable instructions, when being executed, arranged to perform a method for use in RF/EM circuit design in accordance with claim 10.

* * * * *